United States Patent [19]

Kusumi

[11] 4,112,385
[45] Sep. 5, 1978

[54] SOUND AMPLIFIER CIRCUIT

[75] Inventor: Jiro Kusumi, Yokohama, Japan

[73] Assignee: Tokyo Shibaura Electric Co., Ltd., Tokyo, Japan

[21] Appl. No.: 785,030

[22] Filed: Apr. 6, 1977

[30] Foreign Application Priority Data

Apr. 9, 1976 [JP] Japan .............................. 51-44197[U]

[51] Int. Cl.$^2$ ............................................. H03F 3/26
[52] U.S. Cl. .................................... 330/262; 179/1 P; 330/149
[58] Field of Search ...................... 330/51, 149, 207 P, 330/262, 284, 298; 179/1 A, 1 P

[56] References Cited

U.S. PATENT DOCUMENTS 3,889,202 6/1975 Suzuki ..................................... 330/51

Primary Examiner—James B. Mullins
Attorney, Agent, or Firm—Finnegan, Henderson, Farabow & Garrett

[57] ABSTRACT

A series circuit comprising a detection transistor and detection resistor is connected in parallel with a decoupling capacitor connected to a signal input terminal of a class B push-pull amplifier. During a power supply OFF period the decoupling capacitor is discharged through the detection transistor and resistor and a drive transistor is turned ON by a voltage generated across the detection resistor, thereby preventing generation of a residual sound and pop sound.

2 Claims, 2 Drawing Figures

SOUND AMPLIFIER CIRCUIT

BACKGROUND OF THE INVENTION

This invention relates to a sound amplifier circuit using a push-pull amplifier.

A residual sound and pop sound generated when a power supply of a sound amplifier circuit is turned OFF is discordant to the human ears and a listener experiences an unpleasant feeling. Such unpleasant residual and pop sounds are generated when a potential on the terminal of a decoupling capacitor connected to the input side of, for example, a class B push-pull amplifier is slightly diminished during a power supply OFF period and a corresponding voltage drop is amplified at the push-pull amplifier for input into a loudspeaker.

SUMMARY OF THE INVENTION

It is accordingly the object of this invention to provide a sound amplifier circuit which permits a listener to always enjoy a pleasant reproducing sound free from any residual and pop sounds.

According to this invention a detection circuit is provided which detects a flow of charge produced during a power supply OFF time from a decoupling capacitor connected to the signal input terminal of push-pull amplifier circuit and a lower side power transistor in the push-pull amplifier is disabled by the output of the detection circuit, thereby preventing generation of any residual and pop sounds.

DETAILED DESCRIPTION OF THE INVENTION

Figure 1:
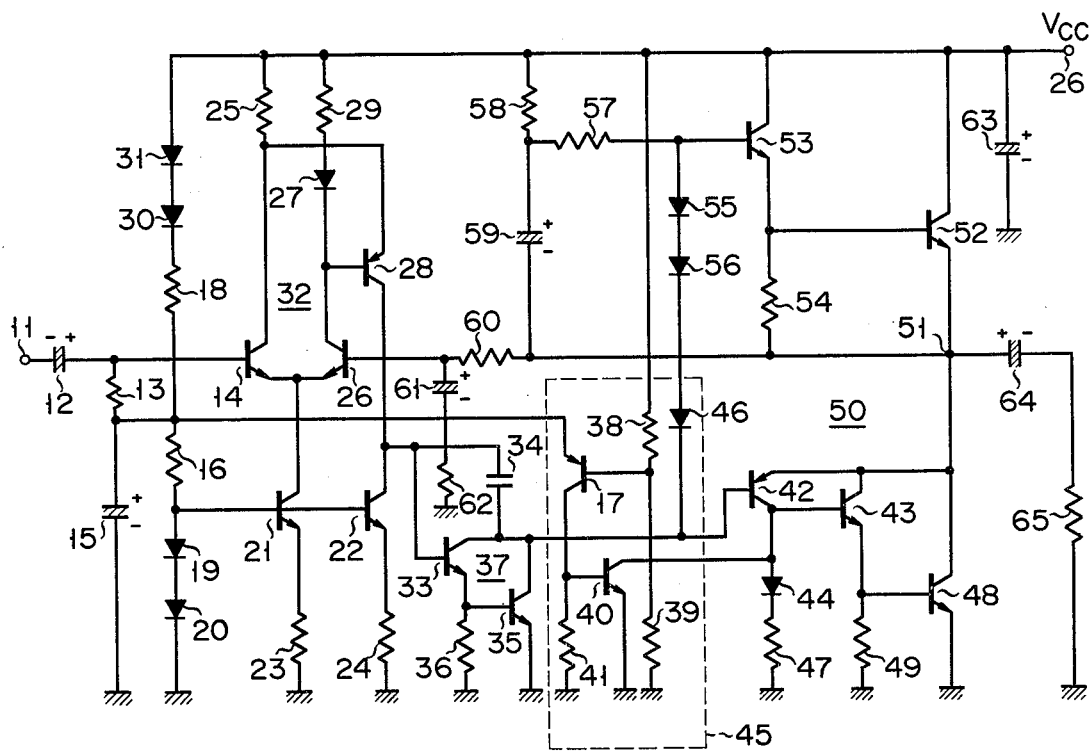
FIG. 1 is a circuit diagram showing a sound amplifier circuit according to one embodiment of this invention.

In FIG. 1, reference numeral 11 denotes an input terminal of an audio signal. The input terminal 11 is connected to a negative terminal of an electrolytic capacitor 12 constituting a coupling capacitor. A positive terminal of the coupling capacitor 12 is connected to one end of a resistor 13 and to the base of an NPN type transistor 14. The other end of the resistor 13 is connected to a positive terminal of an electrolytic capacitor 15 constituting a decoupling capacitor, one end of a resistor 16, the emitter of a PNP transistor 17 for detection, and one end of a resistor 18. A negative terminal of the decoupling capacitor 15 is grounded and the other end of the resistor 16 is also grounded through forward-connected two diodes 19 and 20. The other end of the resistor 16 is connected to the bases of NPN transistors 21 and 22. The emitters of the transistor 21 and 22 are grounded respectively through resistors 23 and 24.

The emitter of the transistor 14 is connected to the collector of the transistor 21 and the collector of the transistor 14 is connected through a resistor 25 to a terminal 26 of a power supply $V_{CC}$. The emitter of the transistor 14 is also connected to the emitter of an NPN type transistor 26 and the collector of the transistor 26 is connected to the cathode of a diode 27 and the base of a PNP type transistor 28. The anode of the diode 27 is connected through a resistor 29 to the power supply terminal 26. The collector of the transistor 28 is connected to the collector of the transistor 22 and the emitter of the transistor 28 is connected to the collector of the transistor 14. The other end of the resistor 18 is connected to the cathode of a diode 30 and the anode of the diode 30 is connected to the cathode of a diode 31. The anode of the diode 31 is connected to the power supply terminal 26. The transistors 14 and 26 constitute a differential amplifier circuit 32.

A junction of the collectors of the transistors 22 and 28 is connected to the base of an NPN type transistor 33 and through a capacitor 34 to the collector of the transistor 33. The emitter of the transistor 33 is connected to the base of an NPN transistor 35 and grounded through a resistor 36. The emitter of the transistor 35 is grounded and the collector of the transistor 35 is connected to the collector of the transistor 33. The transistors 33 and 35 are Darlington-connected to provide a sound signal amplifier 37.

The base of the transistor 17 is connected to a junction of series-connected resistors 38 and 39 constituting a voltage divider which is connected between the power supply terminal 26 and ground. The collector of the transistor 17 is connected to the base of an NPN transistor 40 and grounded through a resistor 41. The transistor 40 has an emitter grounded and a collector connected to the collector of a PNP transistor 42, the base of a transistor 43 and the anode of a diode 44. A circuit including the transistor 17 and 40 and enclosed by a broken line constitutes a detection circuit 45 for detection a flow of charge from the decoupling capacitor 15 adapted to prevent a residual sound and pop sound occuring during a power supply OFF period as will later be described.

A junction between the collectors of the transistors 33 and 35 is connected to the cathode of a diode 46 and the base of the transistor 42. The collector of the transistor 42 is grounded through the diode 44 and resistor 47 and connected to the base of the transistor 43. The emitter of the transistor 42 is connected to the collector of the transistor 43 and the collector of an NPN transistor 48. The emitter of the transistor 43 is connected to the base of the transistor 48 and grounded through a resistor 49. The emitter of the transistor 48 is grounded. The transistors 42, 43 and 48 constitute a lower side power amplifier stage of a class B push-pull amplifier 50 where the transistor 43 functions as a driver for the output transistor 48 and the transistor 42 constitutes a drive transistor for phase conversion.

A junction 51 is an output terminal of the push-pull amplifier 50. The output terminal 51 is connected to the emitter of an output PNP transistor 52 constituting an upper side power amplifier stage. The base of the transistor 52 is connected to the emitter of an NPN transistor 53 for driver and the collectors of the transistors 52 and 53 are connected to the power supply $V_{CC}$ terminal 26. The emitter of the transistor 53 is connected through a resistor 54 to the output terminal 51. The base of the transistor 53 is connected through forward-connected diodes 55 and 56 and diode 46 to the base of the transistor 42. The base of the transistor 53 is also connected through a resistor 57 to a junction between a resistor 58 and an electrolytic capacitor 59. The other end of the resistor 58 is connected to the power supply $V_{CC}$ terminal 26 and a negative terminal of the capacitor 59 is connected to a junction between the output terminal 51 and one end of a resistor 60. The other end of the resistor 60 is connected to the base of the transistor 26 and ground through a series circuit of an electrolytic capacitor 61 and a resistor 62.

The power supply $V_{CC}$ terminal 26 is grounded through an electrolytic capacitor 63. The output terminal 51 is connected through an output capacitor 64 to one end of an equivalent resistor 65 of a loudspeaker. The other end of the equivalent resistor 65 is grounded.

In the circuit arrangement shown in FIG. 1 the resistors 16 and 18 have substantially equal resistive values and the diodes 19, 20, 30 an 31 have substantially equal electrical properties. A relatively stable voltage $V_{CC}/2$ is obtained at a junction between the resistors 16 and 18. In consequence, a stable bias voltage is supplied to the bases of the transistors 21 and 22 which function as a constant current power supply.

When a voltage $V_{CC}$ is supplied to the terminal 26, an audio signal supplied to the input terminal 11 is after amplified at the differential amplifier 32 and transistor 28, supplied to the base of the transistor 33 and amplified at the sound signal amplifier 37 comprised of transistor 33 and 35. The output of the sound amplifier 37 is connected directly to the base of the transistor 42 and through the diodes 46, 55 and 56 to the base of the transistor 53. That is, the positive side component of the sound signal is polarity-reversed at the transistor 42 and amplified at the lower side power transistors 43 and 48, while the negative side component of the sound signal is amplified at the transistors 53 and 52. The output signals of the transistors 48 and 52 are combined at the output terminal 51 and supplied through the output coupling capacitor 64 to the equivalent resistor 65 of the loudspeaker.

Figure 2:
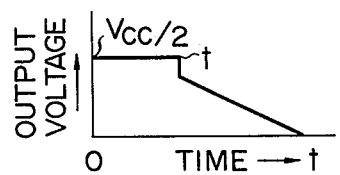
FIG. 2 is a waveform diagram showing a potential on the DC output terminal of the circuit in FIG. 1.

When the power source voltage $V_{CC}$ is cut off, the input decoupling capacitor 15 is discharged through the transistor 17 and resistor 41. At this time, the base potential of the transistor 40 is raised by a discharge current through the resistor 41, causing the transistor 40 to be turned ON to permit the base of the lower side power transistor 43 to be substantially grounded through the transistor 40. Since the transistor 43 is cut off, the lower side amplifier stage transistors 43 and 48 do not cause the output coupling capacitor 64 to be discharged during a time period in which the power supply $V_{CC}$ is turned OFF. Upon conparison a potential on the terminal of the input decoupling capacitor 15 becomes always lower than a potential on the output terminal 51. As a result, the upper side power transistors 52 and 53 are cut off and the output coupling capacitor 64 is not charged. Since the upper side power transistors 52 and 53 and lower side power transistors 43 and 48 are maintained in the OFF state, the output coupling capacitor 64 is neither charged or discharged and no residual sound and pop sound are generated from the loudspeaker 65. A potential on the ouput terminal 51 gradually diminishes from $V_{CC}/2$ with a decrease in the potential of the terminal of the capacitor 15 resulting from the discharge of the input decoupling capacitor 15. The state of potential drop on the output terminal 51 is as shown in FIG. 2. As will be seen from FIG. 2, at time $t$ the cutoff of the power supply voltage $V_{CC}$ is effected.

What is claimed is:

1. A sound amplifier circuit comprising a power supply terminal; a signal output terminal; a push-pull amplifier comprising an upper side power transistor circuit connected between the power supply terminal and the output terminal to amplify the upper side portion of an amplitude of an input signal, a reference potential source and a lower side power transistor circuit connected between the reference potential source and the signal output terminal to amplify the lower side portion of an amplitude of the input signal; an input signal terminal; an input decoupling capacitor coupled to the input signal terminal; a detection circuit parallely connected across the input decoupling capacitor to detect a discharge of the input decoupling capacitor; and means for causing the lower side power transistor circuit to be disabled by an output of the detection circuit.

2. A sound amplifier circuit according to claim 1, in which said detection circuit comprises series-connected a first transistor and resistor, and said means includes a second transistor having a base connected to a junction between the first transistor and the resistor and a collector-to-emitter path connected between the signal input terminal of the lower side power transistor and the reference potential source.

* * * * *